United States Patent
Zhang

(10) Patent No.: US 8,131,387 B2
(45) Date of Patent: Mar. 6, 2012

(54) INTEGRATED HIGH-EFFICIENCY MICROWAVE SOURCING CONTROL PROCESS

(75) Inventor: Yong Zhang, Acton, MA (US)

(73) Assignee: Teradyne, Inc., North Reading, MA (US)

( * ) Notice: Subject to any disclaimer, the term of this patent is extended or adjusted under 35 U.S.C. 154(b) by 1138 days.

(21) Appl. No.: 11/836,331

(22) Filed: Aug. 9, 2007

(65) Prior Publication Data

US 2009/0043526 A1 Feb. 12, 2009

(51) Int. Cl.
*G05B 9/02* (2006.01)
(52) U.S. Cl. .......................................... 700/81; 700/108
(58) Field of Classification Search ...................... 700/81
See application file for complete search history.

(56) References Cited

U.S. PATENT DOCUMENTS

| | | | | |
|---|---|---|---|---|
| 5,251,150 | A * | 10/1993 | Ladner et al. | 702/127 |
| 5,371,851 | A * | 12/1994 | Pieper et al. | 345/501 |
| 5,864,668 | A * | 1/1999 | Andert et al. | 709/203 |
| 5,910,895 | A | 6/1999 | Proskauer et al. | |
| 6,107,818 | A | 8/2000 | Czamara | |
| 6,112,017 | A * | 8/2000 | Wise | 712/200 |
| 6,163,223 | A | 12/2000 | Kapetanic et al. | |
| 6,363,507 | B1 | 3/2002 | Truebenbach et al. | |
| 6,397,160 | B1 * | 5/2002 | Craig et al. | 702/120 |
| 6,449,744 | B1 | 9/2002 | Hansen | |
| 6,564,270 | B1 * | 5/2003 | Andert et al. | 710/33 |
| 6,643,597 | B1 | 11/2003 | Dunsmore | |
| 7,050,343 | B2 * | 5/2006 | Kumar et al. | 365/201 |
| 7,171,587 | B2 | 1/2007 | Hlotyak et al. | |
| 7,184,917 | B2 * | 2/2007 | Pramanick et al. | 702/120 |
| 7,253,607 | B2 | 8/2007 | Hlotyak et al. | |
| 7,254,508 | B2 | 8/2007 | Hlotyak et al. | |
| 7,331,006 | B2 * | 2/2008 | Chang et al. | 714/735 |
| 7,376,876 | B2 * | 5/2008 | Raul et al. | 714/738 |
| 7,673,197 | B2 * | 3/2010 | Luff et al. | 714/724 |
| 7,844,412 | B2 * | 11/2010 | Blancha et al. | 702/122 |
| 7,869,986 | B2 * | 1/2011 | Blancha et al. | 703/22 |
| 2002/0015401 | A1 * | 2/2002 | Subramanian et al. | 370/347 |
| 2002/0031166 | A1 * | 3/2002 | Subramanian et al. | 375/130 |
| 2004/0107125 | A1 * | 6/2004 | Guheen et al. | 705/7 |
| 2004/0225459 | A1 * | 11/2004 | Krishnaswamy et al. | 702/57 |
| 2005/0040250 | A1 * | 2/2005 | Wruck | 236/51 |
| 2005/0097515 | A1 * | 5/2005 | Ribling | 717/124 |
| 2005/0171722 | A1 * | 8/2005 | Fritzsche | 702/122 |

(Continued)

FOREIGN PATENT DOCUMENTS

EP 00 715 177 B1 6/1996

(Continued)

*Primary Examiner* — Albert Decady
*Assistant Examiner* — Anthony Whittington
(74) *Attorney, Agent, or Firm* — BainwoodHuang

(57) ABSTRACT

A technique for controlling instrumentation in an automatic test system includes providing a group of hardware resources that can be configured in a variety of ways to realize different instrument configurations, which generally correspond to different traditional instrument types. An instrument driver is provided for each of the different instrument configurations, and calls to each instrument driver may be inserted into a test program for controlling the respective instrument configuration. The instrument drivers direct control of the hardware resources via a support driver. The support driver thus provides a central location through which control of the various hardware configurations is processed. From the user's point of view, the instrumentation is programmed as if it consists of a collection of traditional instrument types. But at the hardware level the instrumentation is highly integrated and efficiently realized.

19 Claims, 6 Drawing Sheets

U.S. PATENT DOCUMENTS

| | | |
|---|---|---|
| 2005/0193306 A1* | 9/2005 | Luff et al. ............... 714/746 |
| 2005/0262396 A1* | 11/2005 | Woodward et al. ......... 714/30 |
| 2005/0268196 A1* | 12/2005 | Chang et al. .............. 714/742 |
| 2005/0282534 A1* | 12/2005 | Subramanian et al. ...... 455/418 |
| 2006/0122814 A1* | 6/2006 | Beens et al. ............. 702/189 |
| 2006/0156137 A1* | 7/2006 | Raul et al. ................ 714/738 |
| 2006/0212254 A1* | 9/2006 | Fritzsche ................. 702/123 |
| 2006/0218456 A1* | 9/2006 | Fritzsche ................. 714/742 |
| 2008/0040708 A1* | 2/2008 | Blancha et al. ........... 717/130 |
| 2008/0040709 A1* | 2/2008 | Blancha et al. ........... 717/130 |

FOREIGN PATENT DOCUMENTS

WO   WO 2004/111768 A2   12/2004

\* cited by examiner

INTEGRATED HIGH-EFFICIENCY MICROWAVE SOURCING CONTROL PROCESS

CROSS-REFERENCES TO RELATED APPLICATIONS

Not Applicable.

STATEMENT REGARDING FEDERALLY SPONSORED RESEARCH OR DEVELOPMENT

Not Applicable.

NAMES OF PARTIES TO A JOINT RESEARCH AGREEMENT

Not Applicable

REFERENCE TO A "SEQUENCE LISTING," A TABLE, OR A COMPUTER PROGRAM LISTING APPENDIX

Not Applicable.

BACKGROUND OF THE INVENTION

1. Field of the Invention

This invention relates generally to automatic test equipment for electronics, and, more particularly, to the control of instrumentation of automatic test equipment for interacting with devices under test.

2. Description of Related Art

Automatic test equipment, or "ATE," is an integral part of electronics test and manufacturing. What began decades ago as collections of manually operated benchtop instruments has evolved into highly integrated systems optimized for precision, speed, and control.

FIG. 1 shows a simplified example of a modern ATE system, or "tester." The tester includes a host computer 110 that controls electronic subsystems 112-118. The electronic subsystems are wired to an interconnect 120, which selectively connects signals from the subsystems to a unit under test, or "UUT" 122, under control of the host computer 110. The UUT is generally a manufactured device or assembly, or a partially manufactured device or assembly, on which electronic testing may be conducted.

The electronic subsystems may include, for example, a power subsystem 112, a digital subsystem 114, an analog subsystem 116, and a microwave subsystem 118. Each subsystem includes instruments. For example, the power subsystem 112 may include fixed power supplies (112a and 112b) as well as various user-programmable power supplies (112c-112d). The digital subsystem 114 may include digital drive/detect instruments (114a-114b) for sourcing digital signals to the UUT 122 and detecting the levels of digital signals produced by the UUT. It may also include a timing generator 114c and a pattern generator 114d. The analog subsystem 116 may include a parametric measurement unit (PMU) 116a, digitizer 116b, arbitrary waveform generator 116c, and timer/counter 116d. The microwave subsystem may include a continuous wave (CW) microwave synthesizer 118a, modulated wave synthesizer 118b, and multi-tone synthesizer 118c, as well as a microwave receiver 118d.

The interconnect 120 is generally an array of switches and connectors arranged for flexibly connecting the instruments of the subsystems 112-118 to different electronic nodes, or "pins," of the UUT 122.

The host computer is the control center of the system. It is configured with computer software for creating and executing "test programs," i.e., collections of user or machine-generated code for testing a UUT. The computer software includes a programming language as well as numerous instrument drivers. The programming language is sometimes a standard computer language, such as Microsoft Visual Basic™. Alternatively, the programming language may be proprietary to the ATE manufacturer, or a combination of standard and proprietary components. The instrument drivers are generally proprietary to the instrument manufacturers.

The role of an instrument driver is to control an instrument. It can generally write to the instrument to configure and activate it and read from the instrument, for example, to determine measured results. The driver exposes one or more software functions to the test program. The test program generally accesses the driver via function or method calls inserted into the test program.

An example of a tester programming language is VBT™, or "Visual Basic for Test," which is used in the Flex™ line of testers produced by Teradyne, Inc. of North Reading Mass. VBT is a modified form of VBA™ (Visual Basic for Applications), and is accessed through a customized version of Microsoft Excel™, known as IG-XL™. Instrument drivers for IG-XL are provided as software modules accessible by a VBT test program.

A longstanding organizing principle of ATE system architecture is to provide a three-way correspondence between instrument function, instrument assembly, and instrument driver. An instrument for performing any given function is generally housed in a physical assembly unique to that instrument and is controlled by a driver unique to that instrument. Different instrument functions are provided in different physical assemblies and are controlled by different drivers.

FIG. 2 illustrates this correspondence. A test program 210 includes function calls to instrument drivers 212, 214, and 216. Each of these drivers controls a single instrument function. Instrument functions are provided in distinct instrument assemblies 222, 224, and 226.

The three-way correspondence offers many benefits. It is simple to use. To control an instrument, a user simply makes one or more function calls to the instrument's driver. The driver's functions are generally a direct reflection of the instrument's capabilities. The three-way correspondence also avoids many hardware conflicts. Because each instrument is a separate assembly containing essentially all the hardware needed to achieve its functionality, the instrument can be configured over the full range of its functionality without concern about how other instruments in the system are configured or whether resources needed for certain functions are available.

We have recognized that this organizing principle may not be optimal, however, particularly going forward. ATE manufacturers are engaged in continuing efforts to reduce costs, power, maintenance requirements, and the physical space occupied by instruments. An effective way of supporting these efforts is through integration of instrument hardware, where different instrument functions are combined on single, or smaller numbers of, assemblies.

We have recognized, however, that instrument integration presents design challenges. These challenges essentially involve maintaining much of the simplicity of use and avoidance of hardware conflicts that the three-way correspondence provided. What is needed is an integrated instrument architecture that addresses these challenges.

BRIEF SUMMARY OF THE INVENTION

In accordance with one embodiment, an architecture for controlling instrumentation for testing devices in an automatic test system includes a plurality of hardware resources. The hardware resources can be grouped and interconnected to form a plurality of instrument configurations, each corresponding to a particular instrument type for performing the functions of the respective instrument type. The architecture also includes a plurality of instrument drivers, one for each of the plurality of instrument configurations, and a support driver. The support driver is accessible by each of the plurality of instrument drivers and includes software for controlling the plurality of hardware resources.

In accordance with another embodiment, an architecture for controlling microwave instrumentation in an automatic test system includes a plurality of microwave testing resources. The microwave testing resources can be grouped and interconnected to form a plurality of instrument configurations, each corresponding to a particular microwave sourcing instrument. The architecture further includes a plurality of instrument drivers, one for each of the plurality of instrument configurations, and a support driver. The support driver is operatively disposed between each of the plurality of instrument drivers and the plurality of microwave testing resources, for controlling the plurality of microwave testing resources in response to direction from the plurality of instrument drivers.

In accordance with yet another embodiment, a method of controlling instrumentation in an automatic test system includes providing a plurality of hardware resources and configuring the plurality of hardware resources for realizing a plurality of instrument configurations. The method further includes controlling the plurality of hardware resources using a support driver and invoking the support driver from a plurality of instrument drivers, wherein a different instrument driver is provided for each of the plurality of instrument configurations.

DETAILED DESCRIPTION OF THE INVENTION

As used throughout this document, words such as "comprising," "including," and "having" are intended to set forth certain items, steps, elements, or aspects of something in an open-ended fashion. Unless a specific statement is made to the contrary, these words do not indicate a closed list to which additional things cannot be added.

Figure 1:
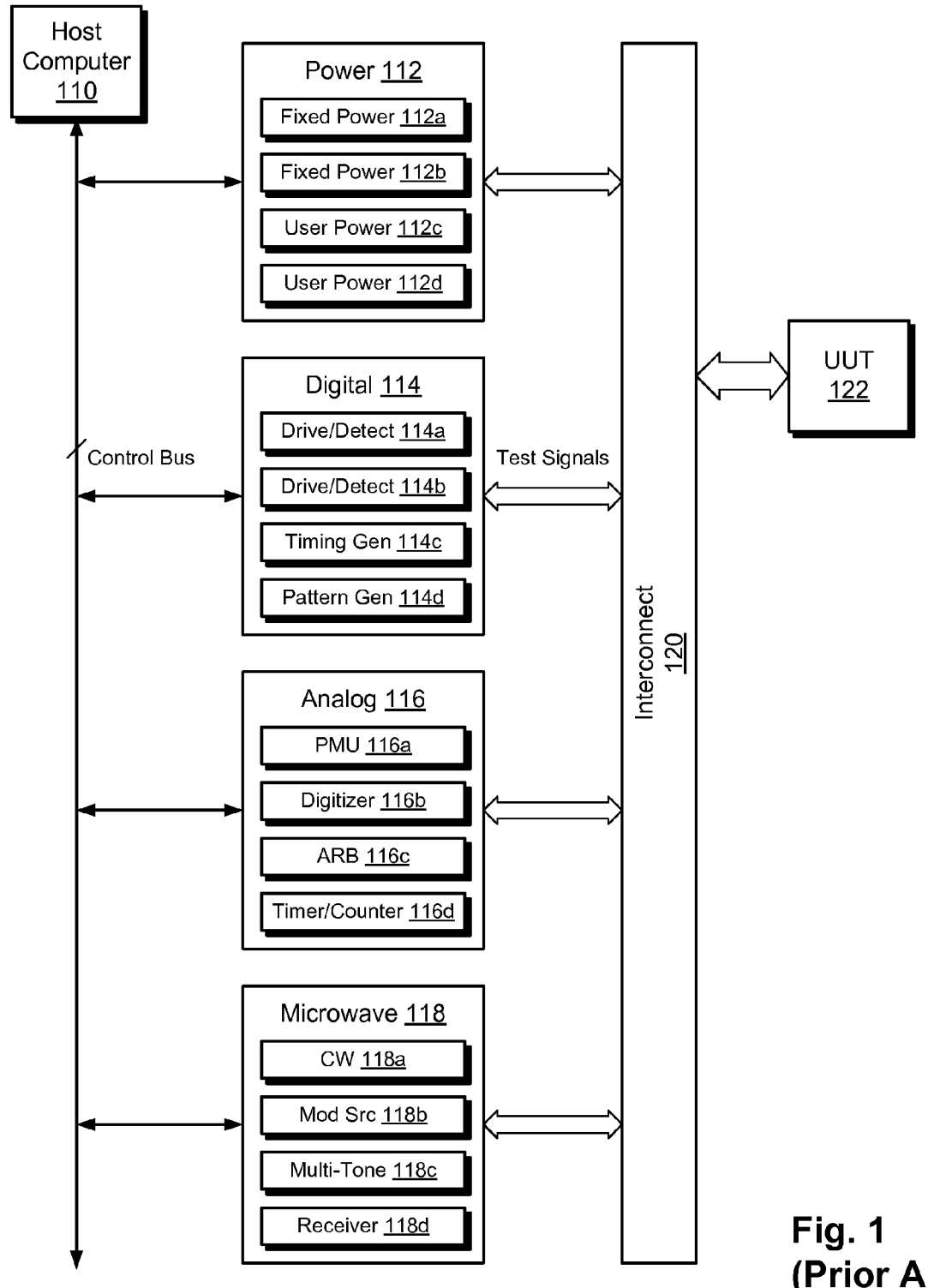
FIG. 1 is a block diagram of the architecture of an ATE system according to the prior art.
Figure 2:
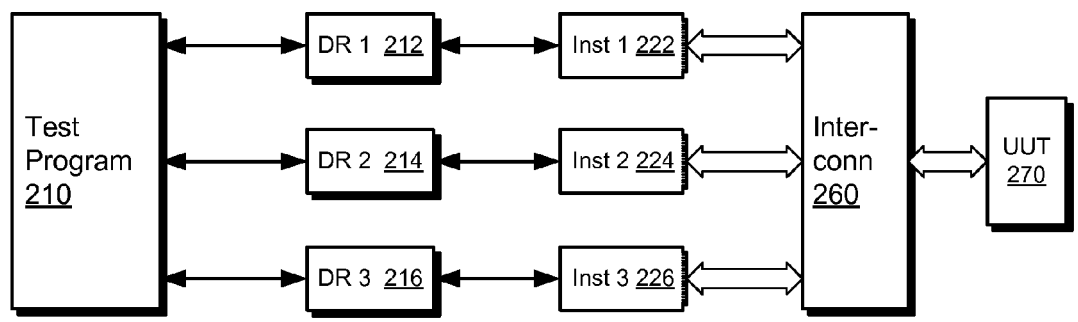
FIG. 2 is a block diagram of an arrangement of drivers and instruments according to the prior art.
Figure 3:
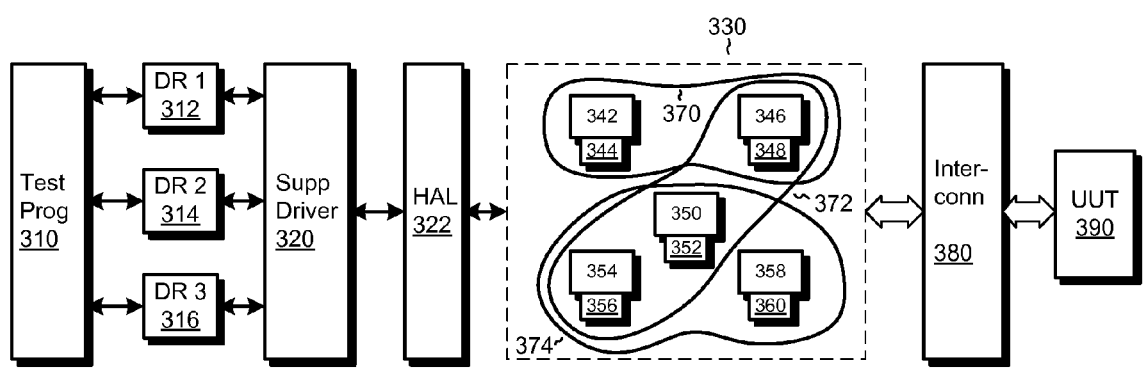
FIG. 3 is a block diagram showing an arrangement for controlling instrument resources according to an embodiment of the invention.

FIG. 3 shows an illustrative embodiment of the invention. Like the architecture shown in FIG. 2, the embodiment shown in FIG. 3 includes a test program 310 for testing a unit under test, or UUT, 390 via an interconnect 380. The elements 310, 380, and 390 operate essentially as described above. However, in contrast with the prior art, which shows discrete instrument types 222, 224, and 226, FIG. 3 shows a collection of hardware resources 330. Five hardware resources are shown, i.e., resources 342, 346, 350, 354, and 358. The resources 330 can be grouped and configured in a variety of ways to provide different instrument configurations. Each instrument configuration corresponds to an interconnected grouping of hardware resources. For example, a first instrument configuration 370 can be formed from the hardware resources 342 and 346. A second instrument configuration 372 can be formed from hardware resources 346, 350, and 354, and a third instrument configuration 374 can be formed from hardware resources 350, 354, and 358. Each of these instrument configurations 370, 372, and 374 performs a particular instrument function, and in effect forms a realization of an instrument type, similar to instrument types 222, 224, and 226 found in the prior art.

Each instrument configuration 370, 372, or 374 is associated with a different instrument driver. For instance, configuration 370 is associated with a driver 312, configuration 372 is associated with a driver 314, and configuration 374 is associated with a driver 316. The drivers 312, 314, and 316 are similar to the drivers 212, 214, and 216 of the prior art to the extent that they can be accessed by the test program for operating respective instrument types. They differ, however, in the scope of their functions.

A support driver 320 is operatively connected between the instrument drivers 312, 314, and 316 and the hardware resources 330. The support driver 320 controls the hardware resources, and the instrument drivers 312, 314, and 316 access the support driver 320 for effecting this control.

Optionally, a hardware abstraction layer (HAL) 322 is operatively disposed between the support driver 320 and the hardware resources 330 for providing an interface between software and hardware. In addition, each hardware resource 342, 346, 350, 354, and 358 may optionally be provided with a corresponding resource driver (344, 348, 352, 356, and 360, respectively). Each resource driver performs low-level reading and writing of the respective hardware resource, in response to direction from the support driver 320, optionally via the HAL 322.

The term "operatively connected" is used herein to describe pathways of communication and/or control that are available to different software elements. It is understood that different software elements are not "connected" in the usual physical sense. Rather, when operating in a computer-controlled environment, they interact through data structures, function calls, software classes, or other software constructs. The term "operatively connected" thus suggests a pathway for data communication and/or control. In a similar manner, software elements may be "operatively disposed" in certain described ways. It should be understood that the physical location of the software code is not what is being described, but rather the logical position of the software element with respect to data flow and/or control. Operative connections need not be direct. Therefore, two software elements can be "operatively connected" even when a third element is "operatively disposed" between them.

The embodiment of FIG. 3 operates essentially as follows. The test program 310 contains encoded instructions for conducting various electronic tests on the UUT 390. These instructions include function calls to the instrument drivers 312, 314, and 316. The instrument drivers receive the function calls, along with any parameters passed, and pass the function calls along to the support driver 320. In some instances, the drivers 312, 314, and 316 simply pass through their respective function calls to the support driver 320. In other instances, the instrument drivers may perform additional processing specific to the respective instrument type.

In response to the function calls from the drivers 312, 314, and 316, the support driver 320 configures the hardware resources 330 to form the desired instrument configuration(s). It sets up the hardware of each instrument configuration for performing the desired testing operations (such as forcing a signal or measuring a signal) prescribed in the test program.

Different instrument configurations may require some of the same hardware resources. For example, in the embodiment of FIG. 3, resource 350 is required by both configuration 372 and configuration 374. Conflicts over hardware resources may therefore arise. In the preferred embodiment, the HAL 322 performs the function of allocating the hardware resources. Alternatively, the support driver 320 may perform this function. If the support driver requires a hardware resource that has already been allocated, the HAL 322 generates an exception. The overall system is preferably designed with sufficient redundancy and flexibility to avoid most allocation exceptions.

In the preferred embodiment, the test program 310 is written in a computer language that is suitable for rapid application development, such as Teradyne's VBT. The instrument drivers 312, 314, and 316, support driver 320, HAL 322, and resource drivers 344, 348, 352, 356, and 360 are preferably written in an object-oriented computer language, such as Microsoft Visual C++™ or C#™. Drivers are preferably represented as classes having sub-classes, properties, and methods. "Function calls" to drivers are implemented by instantiating the driver classes and executing their methods. Values returned by executed methods preferably provide status, such as any errors (including allocation exceptions) produced by executing the method.

Figure 4:
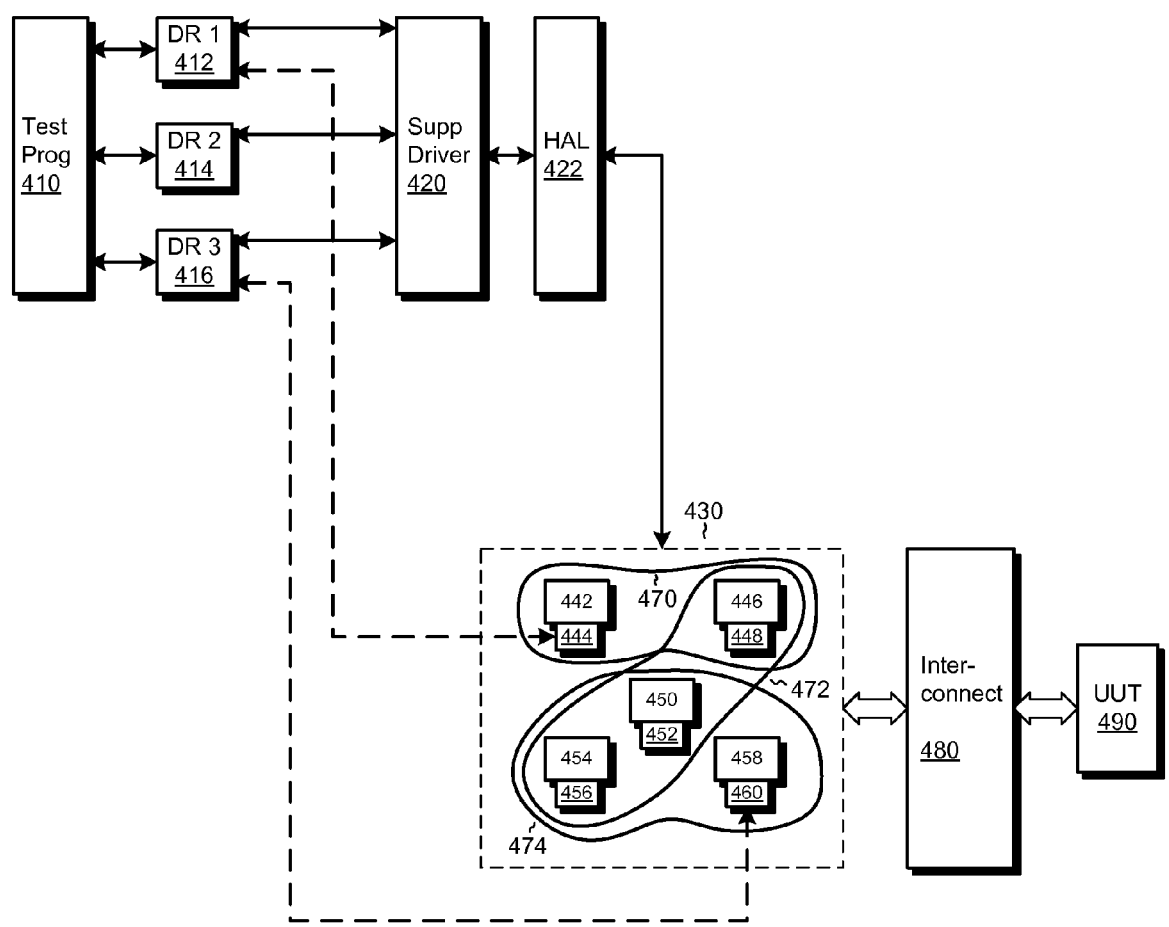
FIG. 4 is a block diagram showing a variant on the arrangement of FIG. 3.

FIG. 4 shows an alternative embodiment of the invention. FIG. 4 is similar to FIG. 3, with corresponding features performing corresponding functions. The difference between the two is that instrument drivers 412 and 416 in FIG. 4 are operatively connected to hardware resources 442 and 458 in addition to being operatively connected to the support driver 420. FIG. 4 thus illustrates that control over hardware resources 430 may be shared between the instrument drivers and the support driver. This arrangement may be effective where certain hardware resources are used by one and only one instrument configuration. In these instances, the hardware resources that are common to different instrument configurations are controlled by the support driver 420, whereas the resources that are unique to single instrument configurations may be controlled by the respective instrument drivers.

Figure 5:
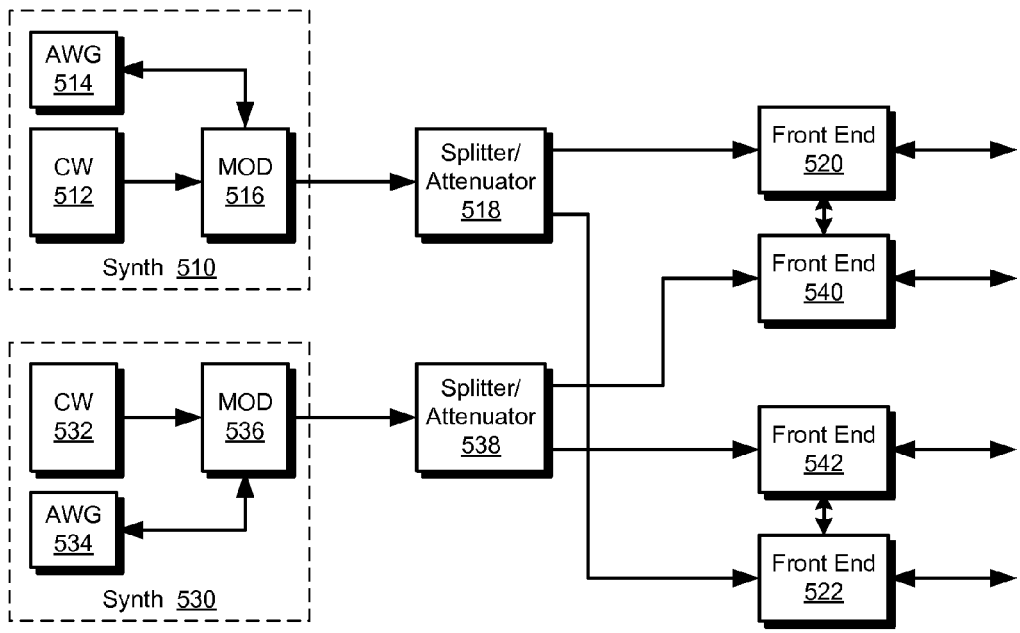
FIG. 5 is a block diagram showing an example of microwave instrument resources that can be controlled according to the arrangement(s) of FIG. 3 and/or 4.

FIG. 5 shows an example of hardware resources 330/430 that can be used in connection with the embodiments of FIGS. 3 and 4. The hardware resources include microwave synthesizers 510 and 530, attenuators/splitters 518 and 538, and front end circuits 520, 522, 540, and 542.

The microwave synthesizers 510 and 530 are preferably identical, although this is not required. Each synthesizer preferably includes a CW (continuous wave) source 512/532, an AWG (arbitrary waveform generator) 514/534 and a modulator 516/536. The CW sources generate sinusoidal microwave signals of programmable frequency and power level. The AWGs generate signals at sub-microwave frequencies, with programmable frequency, amplitude, and wave shape. The modulators 516/536 mix the output of each CW with the output of the respective AWG to produce modulated microwave signals. The AWGs can preferably be disconnected or programmed to zero, to allow the synthesizers to produce CW signals in addition to modulated signals. This arrangement thus allows each synthesizer to fill the role of both a CW source instrument and a modulated source instrument.

Each synthesizer 510/530 is connected to a respective splitter/attenuator 518/538. The splitter/attenuators are also preferably identical, although this is not required. Each splitter/attenuator preferably includes a power splitter, for distributing the respective synthesizer output to different circuit paths. Each circuit path preferably includes its own programmable step attenuator, for coarsely adjusting the power level of its respective version of the synthesizer output.

The different versions of the synthesizer output are provided on different outputs of the respective splitter/attenuator. These outputs are then connected to the front end circuits. In particular, the outputs from splitter/attenuator 518 are connected to inputs of front end circuits 520 and 522, and the outputs of splitter/attenuator 538 are connected to inputs of front end circuits 540 and 542. Connections are provided between front end circuits 520 and 540 and between front end circuits 522 and 542, to allow signal combination for providing multi-tone output signals. Outputs of the front-end circuits are provided to the interconnect 380/480 for connection to the UUT 390/490.

Figure 6:
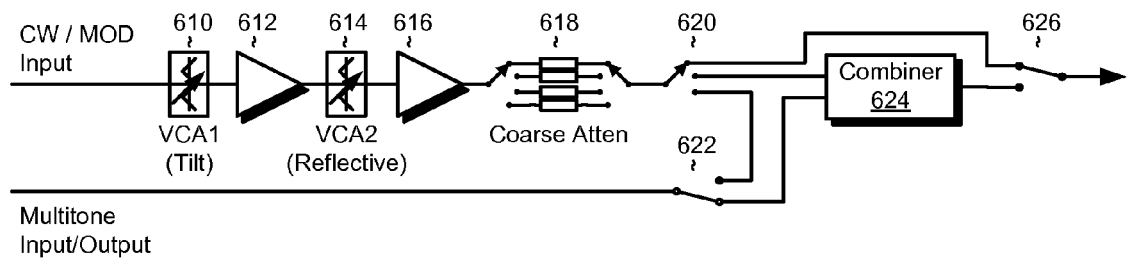
FIG. 6 is a simplified schematic that shows an example of front end circuitry of FIG. 5, configured for providing continuous wave (CW) or modulated wave output signals.

FIG. 6 shows a detailed view of the front end circuits 520, 522, 540, and 542. The front end circuits are preferably identical, although this is not required. Each front end circuit includes a first VCA (voltage-controlled attenuator) 610, a first amplifier 612, a second VCA 614, a second amplifier 616, a coarse attenuator 618, a combiner 624, and switches 620, 622, and 626.

The front end circuits are programmable for adjusting the output level and frequency response of signals, and for optionally combining signals to produce multi-tone outputs. The first VCA 610 is preferably a "tilt" VCA, which is programmable for achieving desired frequency response characteristics. The second VCA 614 is preferably "reflective," with programmable impedance, and the coarse attenuator 618 is preferably programmable for achieving a desired level of signal attenuation. The role of the combiner 624 is to add together the two signals at its inputs to produce a multi-tone signal at its output. With the switches 620 and 626 in their respective "up" positions, the combiner 624 is bypassed. In this arrangement, there is no signal combination and a multi-tone signal is not produced. The configuration shown in FIG. 6 can be used, however, for producing either a CW output signal or a modulated output signal, with the nature of the signal being determined by the synthesizer (510 or 530) that drives the respective front end circuit.

Figure 7:
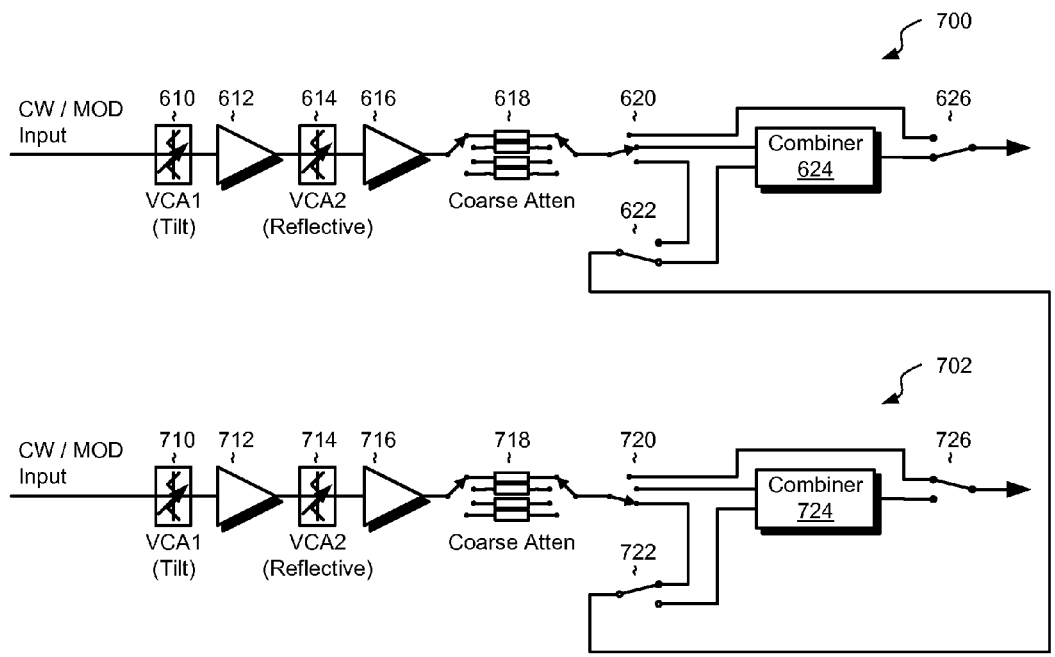
FIG. 7 is a simplified schematic showing a pair of front-end circuitry configured for providing multi-tone output signals.

FIG. 7 shows a pair of front end circuits 700 and 702 configured and connected together for producing a multi-tone output signal. Each of the front end circuits 700 and 702 is identical to the one shown in FIG. 6; however, their switch configurations are different. For the circuit 700, the switch 620 is set to its middle position. This setting conveys a conditioned version of the circuit's input signal (CW/MOD Input) to a first input of the combiner 624. The switch 622 is set to its "down" position, connecting the output of the second front end circuit 702 to a second input of the combiner 624. The switch 626 is also set to its "down" position, so that the output of the combiner 624 provides the output of the circuit 700.

In the second front end circuit 702, the switch 720 is set to its "down" position and the switch 722 is set to its "up" position. This arrangement conveys the conditioned version of the circuit's input signal to the switch 622 of the front end circuit 700, and then on to the second input of the combiner 624. The output of the combiner 624 thus consists of a sum of the signals received and processed by both front end circuits 700 and 702. Notably, the signals that are added by the combiner 624 can each be either CW or modulated signals. Thus, the multi-tone output signal can be the sum of two CW signals, one CW signal and one modulated signal, or two modulated signals.

The hardware resources shown in FIG. 5 can thus be flexibly configured for achieving no fewer than three instrument functions: CW source, modulated source, and multi-tone source.

Figure 8:
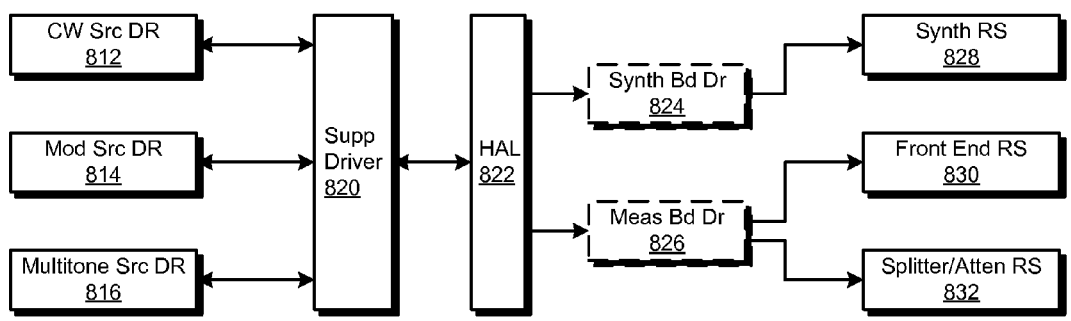
FIG. 8 is a block diagram of drivers for controlling the microwave instrument resources of FIGS. 5-7, including a support driver.

FIG. 8 shows an arrangement of software drivers for controlling the hardware resources shown in the implementation of FIG. 5. Three instrument drivers correspond to the three instrument types supported, i.e., a CW source driver 812, a modulated source driver 814, and a multi-tone source driver 816. Each of these drivers is operatively connected to a support driver 820, which is operatively connected to a HAL 822. The HAL is operatively connected to hardware resource drivers. These include a synthesizer resource driver 828, a front end resource driver 830, and a splitter/attenuator resource driver 832. These resource drivers provide low-level reading and writing of the synthesizers 510 and 530, front end circuits 520, 522, 540, and 542, and splitter/attenuators 518 and 538. An additional layer of board-level drivers is optionally provided between the HAL 822 and the resource drivers 828, 830, and 832, in the form of a synthesizer board driver 824 and a measurement board driver 826. The role of the board-level drivers is to provide control over particular types of circuit board assemblies. In the implementation of FIG. 5, synthesizers 510 and 530 may be housed on one or more circuit board assemblies, and front end circuits 520, 522, 540, and 542 and splitter/attenuators 518 and 538 may be housed on one or more others. Circuitry can be allocated to circuit-board assemblies in whatever manner is desired and convenient. Providing separate drivers per board type confers an additional level of control.

Figure 9:
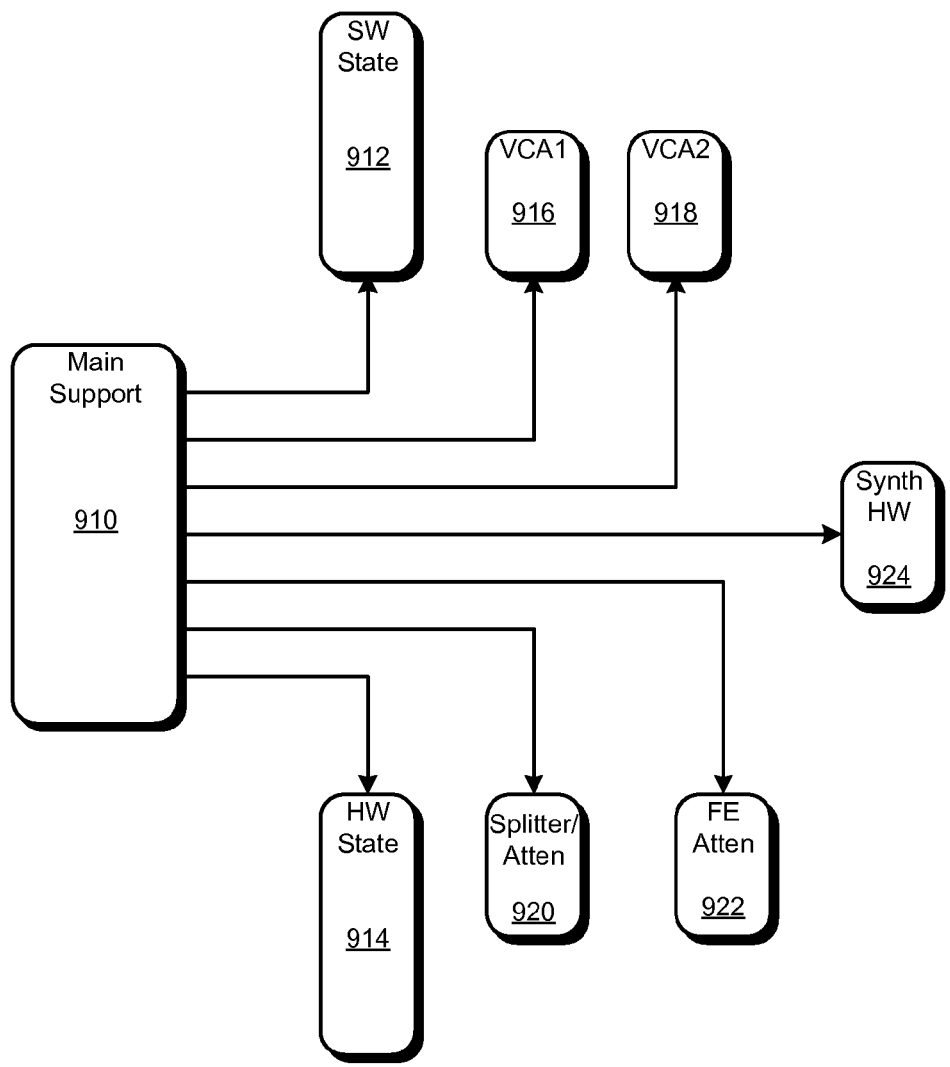
FIG. 9 is a block diagram showing an arrangement of software classes for implementing the support driver of FIG. 8.

FIG. 9 shows the object model for the support driver 820. The support driver 820 is preferably implemented as a software class 910 including various subclasses. The subclasses include a software state subclass 912, a hardware state subclass 914, and a number of subclasses corresponding to different hardware elements from among the hardware resources.

The main support class 910 includes code for setting up hardware and interpreting results. This code preferably includes configuration code for arranging the various hardware resources into the desired instrument types, calibration processes for manipulating calibration data and calibrating the hardware resources, and leveling software. The leveling software performs the function of adjusting the power level and frequency response of output signals delivered from the CW source, modulated source, and multi-tone source instrument functions.

The software state subclass 912 maintains a record of how the hardware resources have been programmed by the various instrument drivers (812, 814, and 816). Settings for all programmable aspects of the hardware resources are preferably stored in this subclass.

The hardware state subclass 914 maintains a record of directives to read and write the hardware resources. Whereas the software state subclass 912 maintains a record of settings sent to the support driver 820 to configure or use instrumentation, the hardware state subclass 914 maintains a record of settings sent from the support driver to lower level drivers to configure or use the hardware.

The support driver 820 also includes subclasses that correspond to different hardware elements of the hardware resources. For controlling elements of the front end circuits 520, 522, 540, and 542, subclasses 916 and 918 are provided for the first and second VCAs 610 and 614, and a subclass 922 is provided for the step attenuator 618. There is also a subclass 920 for controlling the splitter/attenuators 518 and 538, and a subclass 924 for controlling the synthesizers 510 and 530. Each of these subclasses defines properties that correspond to physical aspects of the respective hardware element. Each also defines methods that correspond to actions that can be performed on or by the hardware element.

The class 910 and each of its subclasses can be instantiated to produce particular instances, which can then be manipulated and executed in software. Multiple instances of a particular subclass can be created to control multiple hardware elements of the same type. For example, two instances of the synthesizer subclass 924 can be created to control the two synthesizers 510 and 530. In the preferred embodiment, users have the option to purchase different numbers and combinations of hardware elements. By allowing different instances to represent and control different hardware, the object model of the support driver is able to support the full range of available hardware configurations.

In addition, the support driver 820 manages the interactions of all the hardware elements as if they formed a single, reconfigurable instrument. It maintains state information, handles interactions to achieve high accuracy, and avoids duplication of code which would result if different instrument drivers were used to control the hardware resources directly.

The architecture described hereinabove achieves a high level of integration, while still presenting a familiar interface to the user. Functionality for different instrument types is achieved without the need for providing instrument types in physically distinct assemblies. At the same time, redundancy is reduced by avoiding undue replication of hardware that is common across different instrument types. By providing different instrument drivers for different instrument types, the experience of the user is not significantly different from the user's experience when different physical instrument types are used. Test programs can be written using driver constructs that are similar to those used before, with different instrument drivers being provided for different instrument types. Internally, however, the support driver manages and coordinates the different hardware resources in a unified and efficient manner.

Having described one embodiment, numerous alternative embodiments or variations can be made. For instance, the preferred embodiment hereof pertains to microwave sourcing instruments. However, this is merely an example. The invention hereof may be used with any type of instrumentation, including but not limited to microwave sourcing and measuring instrumentation, analog instrumentation, digital instrumentation, and power supplies.

As shown and described, the support driver 820 exclusively controls the hardware resources. This is merely an example, however. As shown in FIG. 4 and described above, control over some or all of the hardware resources may be shared between the support driver and one or more of the instrument drivers.

In the preferred embodiment, the various hardware resources are housed on two different circuit board assemblies, a synthesizer board assembly and a measure board assembly. This is merely an example. Alternatively, the hardware resources can be housed on a single assembly or on greater than two assemblies.

As shown and described, the term "instrument configuration" refers to a configuration of hardware. However, it may also refer to a configuration of software used to establish the hardware settings.

Those skilled in the art will therefore understand that various changes in form and detail may be made to the embodiments disclosed herein without departing from the scope of the invention.

What is claimed is:

1. An architecture for controlling instrumentation for testing devices in an automatic test system, comprising:
   a plurality of hardware resources configurable to form
   a plurality of instrument configurations, each corresponding to a particular instrument type and including a grouping of the plurality of hardware resources interconnected to perform the functions of the respective instrument type, wherein different instrument configurations perform the functions of different instrument types and at least one of the plurality of hardware resources is used in greater than one of the plurality of instrument configurations;
   a plurality of instrument drivers, one for each of the plurality of instrument configurations; and
   a support driver, accessible by each of the plurality of instrument drivers and including software for controlling the plurality of hardware resources,
   wherein the support driver comprises a plurality of software classes, each software class corresponding to a different one of the plurality of hardware resources.

2. An architecture as recited in claim 1, further comprising a hardware abstraction layer (HAL) operatively disposed between the support driver and the plurality of hardware resources.

3. An architecture as recited in claim 1, wherein each of the plurality of instrument drivers includes software for accessing the support driver for controlling the plurality of hardware resources.

4. An architecture as recited in claim 3, wherein the software includes function calls.

5. An architecture as recited in claim 1, further comprising a plurality of resource drivers, one for each of the plurality of hardware resources, for reading from and writing to the respective hardware resource.

6. An architecture as recited in claim 5, wherein the plurality of hardware resources is distributed across a plurality of circuit boards, and further comprising a plurality of board-level drivers operatively disposed between the support driver and the plurality of resource drivers.

7. An architecture as recited in claim 1, wherein the plurality of hardware resources is distributed across a plurality of circuit boards, and further comprising a plurality of board-level drivers operatively disposed between the support driver and the plurality of hardware resources.

8. An architecture as recited in claim 1, wherein the support driver includes a class for storing a software state of the plurality of hardware resources corresponding to test program settings of the plurality of hardware resources.

9. An architecture as recited in claim 1, wherein the support driver includes a class for storing a hardware state that corresponds to values written to the plurality of hardware resources.

10. An architecture as recited in claim 1, further comprising a test program that includes software for accessing at least one of the plurality of instrument drivers.

11. An architecture as recited in claim 1, wherein the plurality of hardware resources comprises a plurality of microwave testing hardware.

12. An architecture as recited in claim 11, wherein the plurality of instrument configurations includes a continuous wave (CW) source, a modulated wave source, and a multi-tone source.

13. A method of controlling instrumentation in an automatic test system, comprising:
    providing a plurality of hardware resources;
    configuring the plurality of hardware resources for realizing a plurality of instrument configurations, including using at least one of the plurality of hardware resources in greater than one of the plurality of instrument configurations;
    controlling the plurality of hardware resources using a support driver; invoking the support driver from a plurality of instrument drivers, wherein a different instrument driver is provided for each of the plurality of instrument configurations; and
    representing, by the support driver, each of the plurality of hardware resources with a software class having properties that relate to characteristics of the respective hardware resource.

14. A method as recited in claim 13, further comprising invoking at least one of the plurality of instrument drivers from a test program for testing a unit under test.

15. An architecture as recited in claim 1, wherein the support driver includes a main support class, the main support class including the plurality of software classes corresponding to the different ones of the plurality of hardware resources, the main support class further including:
    an encoded configuration process for arranging the plurality of hardware resources into the plurality of instrument configurations;
    a software state subclass for maintaining a record of settings received by the support driver from the plurality of instrument drivers to configure and use the plurality of hardware resources; and
    a hardware state subclass for maintaining a record of settings sent from the support driver to lower level drivers to configure and use the plurality of hardware resources.

16. An architecture as recited in claim 15, wherein the main support class further includes:
    encoded calibration processes for calibrating the plurality of hardware resources; and
    encoded leveling processes for adjusting power level and frequency response of output signals delivered from the plurality of hardware resources.

17. An architecture for controlling instrumentation for testing devices in an automatic test system, comprising:
    a plurality of hardware resources;
    a support driver for controlling the plurality of hardware resources, the support driver including—
      a main support class representing the plurality of hardware resources in an object-oriented software construct that includes encoded instructions for arranging the plurality of hardware resources in different combinations to form different instrument configurations; and
      a plurality of sub-classes of the main support class, each sub-class being instantiable to represent an element of the plurality of hardware resources as an object-oriented software construct; and
    a plurality of instrument drivers, each instrument driver operatively coupled to the support driver for controlling a different one of the instrument configurations via the main support class and at least one of the plurality of sub-classes of the main support class.

18. An architecture as recited in claim 17, wherein each sub-class of the main support class is instantiable multiple times to represent multiple hardware elements of the same type simultaneously.

19. An architecture as recited in claim 17, wherein the support driver further includes:

a software state subclass for maintaining a record of settings received by the support driver from the plurality of instrument drivers to configure and use the plurality of hardware resources; and a hardware state subclass for maintaining a record of settings sent from the support driver to lower level drivers to configure and use the plurality of hardware resources.

* * * * *